United States Patent
Yan et al.

(10) Patent No.: US 10,236,190 B2
(45) Date of Patent: Mar. 19, 2019

(54) METHOD FOR WAFER OUTGASSING CONTROL

(71) Applicant: Applied Materials, Inc., Santa Clara, CA (US)

(72) Inventors: Chun Yan, San Jose, CA (US); Xinyu Bao, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/588,641

(22) Filed: May 6, 2017

(65) Prior Publication Data

US 2017/0352557 A1 Dec. 7, 2017

Related U.S. Application Data

(60) Provisional application No. 62/346,288, filed on Jun. 6, 2016.

(51) Int. Cl.
| | | |
|---|---|---|
| *H01L 21/302* | (2006.01) | |
| *H01L 21/67* | (2006.01) | |
| *H01L 21/3065* | (2006.01) | |
| *H01L 21/306* | (2006.01) | |

(52) U.S. Cl.
CPC .... *H01L 21/67017* (2013.01); *H01L 21/3065* (2013.01); *H01L 21/30621* (2013.01); *H01L 21/30655* (2013.01); *H01L 21/67201* (2013.01); *Y02P 80/30* (2015.11)

(58) Field of Classification Search
CPC ......... H01L 21/30621; H01L 21/67201; H01L 21/67017; H01L 21/30655

USPC .................................. 438/706, 714, 716
See application file for complete search history.

(56) References Cited

U.S. PATENT DOCUMENTS

| | | |
|---|---|---|
| 6,413,844 B1 | 7/2002 | Beulens et al. |
| 8,821,643 B2 | 9/2014 | Ramachandran et al. |
| 2006/0199384 A1* | 9/2006 | Ando .................... C23C 16/401 438/680 |
| 2011/0008972 A1 | 1/2011 | Damjanovic et al. |

(Continued)

FOREIGN PATENT DOCUMENTS

| | | |
|---|---|---|
| JP | H0536653 A | 2/1993 |
| JP | H11087337 A | 3/1999 |

(Continued)

OTHER PUBLICATIONS

International Search Report and Written Opinion for PCT/US2017/027001 dated Jul. 24, 2017.

(Continued)

*Primary Examiner* — Binh X Tran
(74) *Attorney, Agent, or Firm* — Patterson + Sheridan LLP

(57) ABSTRACT

Embodiments disclosed herein generally relate to methods for controlling substrate outgassing such that hazardous gasses are eliminated from a surface of a substrate after a III-V epitaxial growth process or an etch clean process, and prior to additional processing. An oxygen containing gas is flowed to a substrate in a load lock chamber, and subsequently a non-reactive gas is flowed to the substrate in the load lock chamber. As such, hazardous gases and outgassing residuals are decreased and/or removed from the substrate such that further processing may be performed.

17 Claims, 4 Drawing Sheets

(56) References Cited

U.S. PATENT DOCUMENTS

2011/0304078 A1* 12/2011 Lee .................. H01L 21/67201
                                                        264/344
2013/0178072 A1   7/2013 Ramachandran et al.
2013/0207171 A1*  8/2013 Uno .................. H01L 21/02189
                                                        257/310

FOREIGN PATENT DOCUMENTS

JP    2000252225 A    9/2000
JP    2006279019 A    10/2006

OTHER PUBLICATIONS

Taiwanese Office Action (with attached English translation of the Search Report) for Application No. 106118301; dated Dec. 18, 2018; 10 total pages.

* cited by examiner

METHOD FOR WAFER OUTGASSING CONTROL

CROSS-REFERENCE TO RELATED APPLICATIONS

This application claims priority to U.S. Provisional Patent Application Ser. No. 62/346,288, filed on Jun. 6, 2016, which herein is incorporated by reference.

BACKGROUND

Field of the Disclosure

Embodiments of the present disclosure generally relate to the fabrication of integrated circuits. More specifically, embodiments disclosed herein relate to methods for controlling substrate outgassing.

Description of the Related Art

The manufacture of modern logic, memory, or integrated circuits typically requires more than four hundred process steps. A number of these steps are thermal processes that raise the temperature of the semiconductor substrate to a target value to induce rearrangement in the atomic order or chemistry of thin surface films (e.g., diffusion, oxidation, recrystallization, salicidation, densification, flow).

Ion implementation is a method for the introduction of chemical impurities in semiconductor substrates to form the p-n junctions necessary for field effect or bipolar transistor fabrication. Such impurities include P-type dopants, such as boron, aluminum, gallium, beryllium, magnesium, and zinc, and N-type dopants such as phosphorus, arsenic, antimony, bismuth, selenium, and tellurium. Ion implantation of chemical impurities disrupts the crystallinity of the semiconductor substrate over the range of the implant. At low energies, relatively little damage occurs to the substrate. However, the implanted dopants will not come to rest on electrically active sites in the substrate. Therefore, an anneal is required to restore the crystallinity of the substrate and drive the implanted dopants onto electrically active crystal sites.

During the processing of the substrate in, for example, an RTP chamber, the substrate may tend to outgas impurities implanted therein. These outgassed impurities may be the dopant material, a material derived from the dopant material, or any other material that may escape the substrate during the annealing process, such as the sublimation of silicon. The outgassed impurities may deposit on the colder walls and on the reflector plate of the chamber. This deposition may interfere with temperature pyrometer readings and with the radiation distribution fields on the substrate, which in turn affects the temperature at which the substrate is annealed. Deposition of the outgassed impurities may also cause unwanted particles on the substrates and may also generate slip lines on the substrate. Depending on the chemical composition of the deposits, the chamber is taken offline for a wet clean process.

Furthermore, one of the biggest challenges for III-V CMOS (FinFET, TFET) mass production is to control the outgassing from the substrates after a III-V epitaxial growth process and/or an etch clean process. Limitations in current outgassing control include that the thermal back process (>200 degrees Celsius) in either a process chamber or an etch chamber is not suitable after a III-V epitaxial growth or etch process as longer bake times for each substrate is necessary to drive out arsenic related outgassing gasses from the substrate surface and throughput is lowered. Furthermore, a long $N_2$ purge/pump cycle is less efficient and has a large impact on throughput. Testing has been performed on the prior known methods and results indicate that after ten cycles of pump/purge, arsenic outgassing was still detected at 1.9 parts per billion.

Absolute zero parts per billion (ppb) outgassing is typically desired for arsenic residuals due to arsenic toxicity. To minimize toxicity from arsenic outgassing during subsequent handling and processing of substrates, there is a need for an improved method for controlling substrate outgassing.

SUMMARY

Embodiments disclosed herein generally relate to methods for controlling substrate outgassing such that hazardous gasses are eliminated from a surface of a substrate after a III-V epitaxial growth process or an etch clean process, and prior to additional processing. In one embodiment, a method for controlling outgassing is disclosed. The method includes (a) delivering a substrate into a substrate access chamber, (b) flowing an oxygen containing gas into the substrate access chamber, and (c) removing a material from a surface of the substrate by reacting the oxygen containing gas with the surface of the substrate. The method also includes (d) ceasing the flow of the oxygen containing gas into the substrate access chamber, (e) flowing a non-reactive gas into the substrate access chamber, and (f) ceasing the flow of the non-reactive gas into the substrate access chamber. The method further includes (g) removing the non-reactive gas from the substrate access chamber via a pump cycle.

In another embodiment, a method for controlling outgassing after a III-V epitaxial process is disclosed. The method includes (a) delivering a substrate to a load lock chamber, (b) flowing an oxygen containing gas into the load lock chamber, and (c) ceasing the flowing of the oxygen containing gas into the load lock chamber. The method further includes (d) flowing an nitrogen containing gas into the load lock chamber, and (e) pumping the nitrogen containing gas out of the load lock chamber.

In another embodiment, a method for controlling outgassing is disclosed. The method includes (a) delivering a substrate to a load lock chamber, (b) flowing oxygen gas into the load lock chamber at a first pressure, wherein the first pressure is between about 60 Torr and about 220 Torr, and (c) ceasing the flowing of the oxygen gas into the load lock chamber. The method also includes (d) flowing an non-reactive gas into the load lock chamber at a second pressure, wherein the second pressure is above about 200 Torr, (e) pumping the non-reactive gas out of the load lock chamber at a third pressure, wherein the third pressure is below about 1 Torr, and (f) repeating (d)-(e) for at least one additional cycle.

BRIEF DESCRIPTION OF THE DRAWINGS

So that the manner in which the above recited features of the disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments disclosed herein generally relate to methods for controlling substrate outgassing such that hazardous gasses are eliminated from a surface of a substrate after a III-V epitaxial growth process or an etch clean process, and prior to additional processing. An oxygen containing gas is flowed to a substrate in a load lock chamber, and subsequently a non-reactive gas is flowed to the substrate in the load lock chamber. As such, hazardous gases and outgassing residuals are decreased and/or removed from the substrate such that further processing may be performed.

Figure 1:
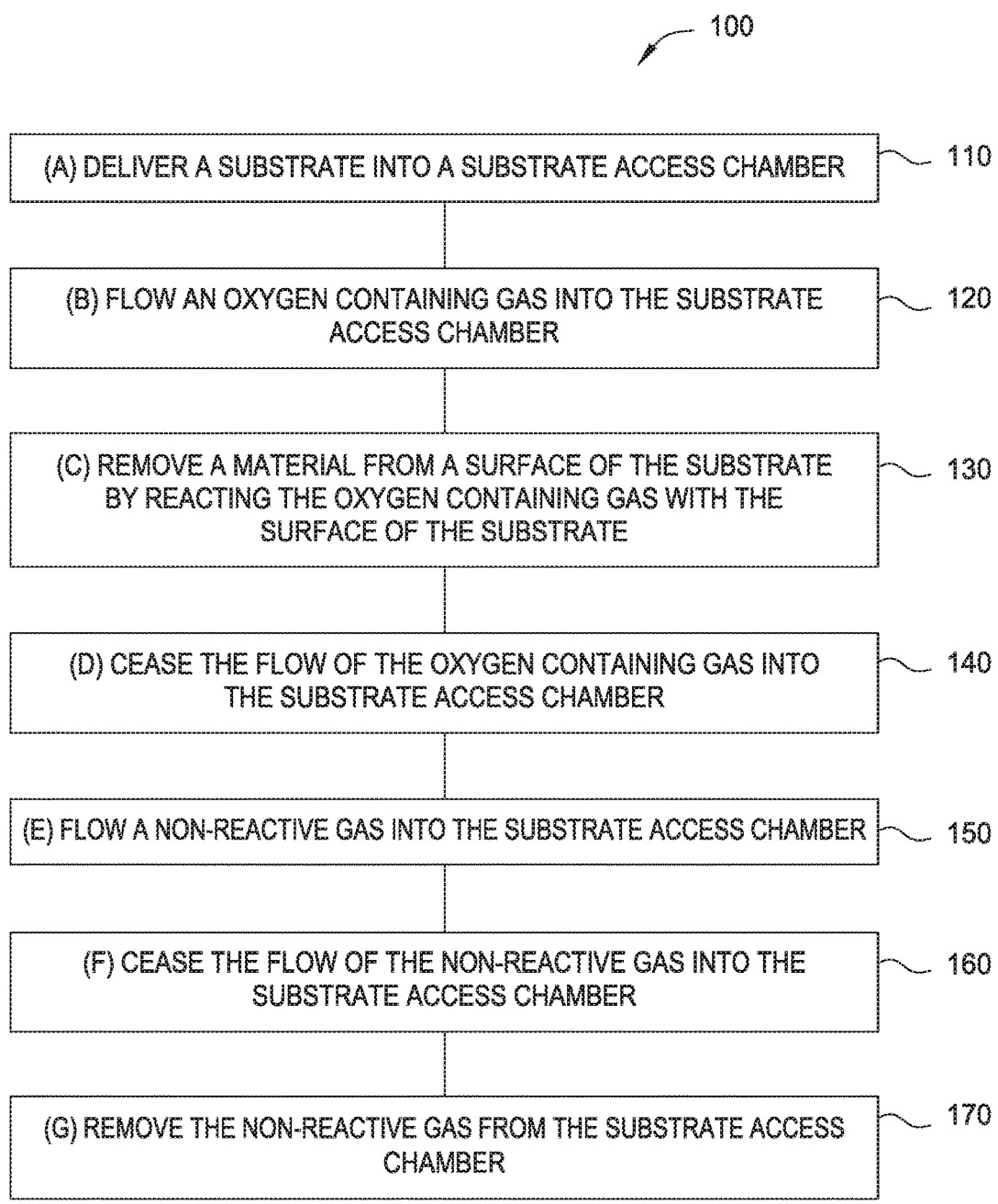
FIG. 1 illustrates a schematic flow diagram of a method for controlling outgassing, according to one embodiment.

FIG. 1 is a schematic flow diagram of a method 100 for controlling outgassing. The method 100 provides operations for reducing outgassing. Substrate outgassing generally relates to the releasing of a gas or vapor product from the substrate or from a surface of the substrate. Controlling outgassing relates to reducing and/or eliminating residual outgassed materials, for example, arsenic, from a substrate prior to transferring the substrate for downstream processing.

A "substrate" or "substrate surface," as described herein, generally refers to any substrate surface upon which processing is performed. For example, a substrate surface may include silicon, silicon oxide, doped silicon, silicon germanium, germanium, gallium arsenide, glass, sapphire, and any other materials, such as metals, metal nitrides, metal alloys, and other conductive or semi-conductive materials, depending on the application. A substrate or substrate surface may also include dielectric materials such as silicon dioxide, silicon nitride, organosilicates, and carbon dopes silicon oxide or nitride materials. The term "substrate" may further include the term "wafer." The substrate itself is not limited to any particular size or shape. Although the implementations described herein are generally made with reference to a round 300 mm substrate, other shapes, such as polygonal, squared, rectangular, curved, or otherwise non-circular workpieces may be utilized according to the implementations described herein.

At operation 110, a substrate is delivered into a substrate access chamber. In some embodiments, the substrate access chamber may be a load lock chamber and/or a FOUP (front opening unified pod). In some embodiments, each substrate may be transferred to the substrate access chamber in a non-reactive gas, for example, after a III-V epitaxial growth process and/or after a III-V etch process.

At operation 120, an oxygen containing flows into the substrate access chamber and, at operation 130, a material is removed from a surface of the substrate by reacting the oxygen containing gas with the surface of the substrate. Typically, a substrate access chamber maintains an inert environment. The flowing of the oxygen containing gas into the substrate access chamber may expose the substrate therein to the oxygen containing gas. The flowing of the oxygen containing gas into the substrate access chamber may occur via a conduit coupled to an oxygen containing gas source and to the substrate access chamber. The oxygen containing gas may flow from the oxygen containing gas source to the substrate access chamber. Upon contacting the substrate, any residual arsenic related species on a surface of the substrate, as well as on the III-V surface, are oxidized. The arsenic residuals are broken down to either stable oxides and/or byproducts which have a high vapor pressure, and therefore evaporate quickly. As such, the deliberate pulsing and/or providing of the oxygen containing gas into the substrate access chamber may pre-remove arsenic in a controlled manner in order to appropriately abate the arsenic.

In some embodiments, the oxygen containing gas is oxygen. It is contemplated that any amount of oxygen containing gas may flow into the substrate access chamber, however, in some embodiments, between about 5 sccm and about 1200 sccm of the oxygen containing gas flows into the substrate access chamber.

The oxygen containing gas flows into the substrate access chamber for between about one second and about 60 seconds, for example, between about one second and about 30 seconds, such as about 10 seconds. Furthermore, the oxygen containing gas is flows into the substrate access chamber at a first pressure (P1). In some embodiments, the first pressure (P1) is between about 60 Torr and about 220 Torr, for example between about 80 Torr and about 200 Torr.

Flowing the oxygen containing gas into the substrate access chamber may allow for stable oxides to form on the surface of the substrate. Also, the oxygen containing gas may allow high vapor pressure byproducts may be removed from the substrate.

Moreover, oxidation may have various effects on the substrate. The oxidation may break the bond of the arsenic species (for example between arsenic and OH groups) to carbon to form arsenic oxide which may leave the surface of the substrate more quickly.

At operation 140, the flow of the oxygen containing gas into the substrate access chamber is ceased.

At operation 150, a non-reactive gas is flowed into the substrate access chamber. The non-reactive gas is flowed into the substrate access chamber for between about 30 seconds and about 400 seconds, for example, between about 60 seconds and about 300 seconds. In some embodiments, the non-reactive gas is flowed into the substrate access chamber at a second pressure (P2). Furthermore, the second pressure (P2) is greater than the first pressure (P1), discussed supra. In some embodiments, the second pressure (P2) is above about 180 Torr, for example, above about 200 Torr. It is contemplated, however, that the second pressure (P2) may be any pressure greater than the first pressure (P1). The non-reactive gas may include a helium-containing gas, a hydrogen-containing gas, a nitrogen-containing gas, and/or an argon-containing gas, among others. In some embodiments, the non-reactive gas is $N_2$. The flowing of the non-reactive gas into the substrate access chamber may occur after the flowing of the oxygen containing gas into the substrate access chamber. The flowing of the non-reactive gas after oxidation drives down outgassing towards to the zero ppb level. The zero ppb level means that the outgassing of toxic species, for example, arsenic, is undetectable.

At operation 160, the flow of the non-reactive gas into the substrate access chamber is ceased.

At operation 170, the non-reactive gas is removed from the substrate access chamber, for example, via a pump cycle.

The removing of the non-reactive gas from the substrate access chamber is at a third pressure (P3). The third pressure is less than the first pressure (P1). In some embodiments, the third pressure is less than about 1 Torr. The third pressure (P3) is lower than the second pressure (P2) and/or the first pressure (P1) during the removal of the non-reactive gas such that when the non-reactive gas is reinserted into the substrate access chamber a strong dilution is provided for. Furthermore, the first pressure (P1) being less than the second pressure (P2) provides for efficiency benefits to improve the reaction rate.

In some embodiments, operation 150, operation 160, and/or operation 170 may be repeated for at least one additional cycle after an initial completion of operation 170. By repeating the flowing of the non-reactive gas into the substrate access chamber, ceasing the flow of the non-reactive gas into the substrate access chamber, and/or removing the non-reactive gas from the substrate access chamber, outgassing is further driven down towards the zero ppb level. Testing has been completed and results indicate that one oxidation operation, such as operation 120, operation 130, and operation 140, and three non-reactive gas cycles, such as operation 150, operation 160, and operation 170, reduce outgassing to zero ppb.

In some embodiments, after outgassing has been reduced, the substrate may be transferred to a FOUP (front opening unified pod) for further down-stream processing.

Figure 2:
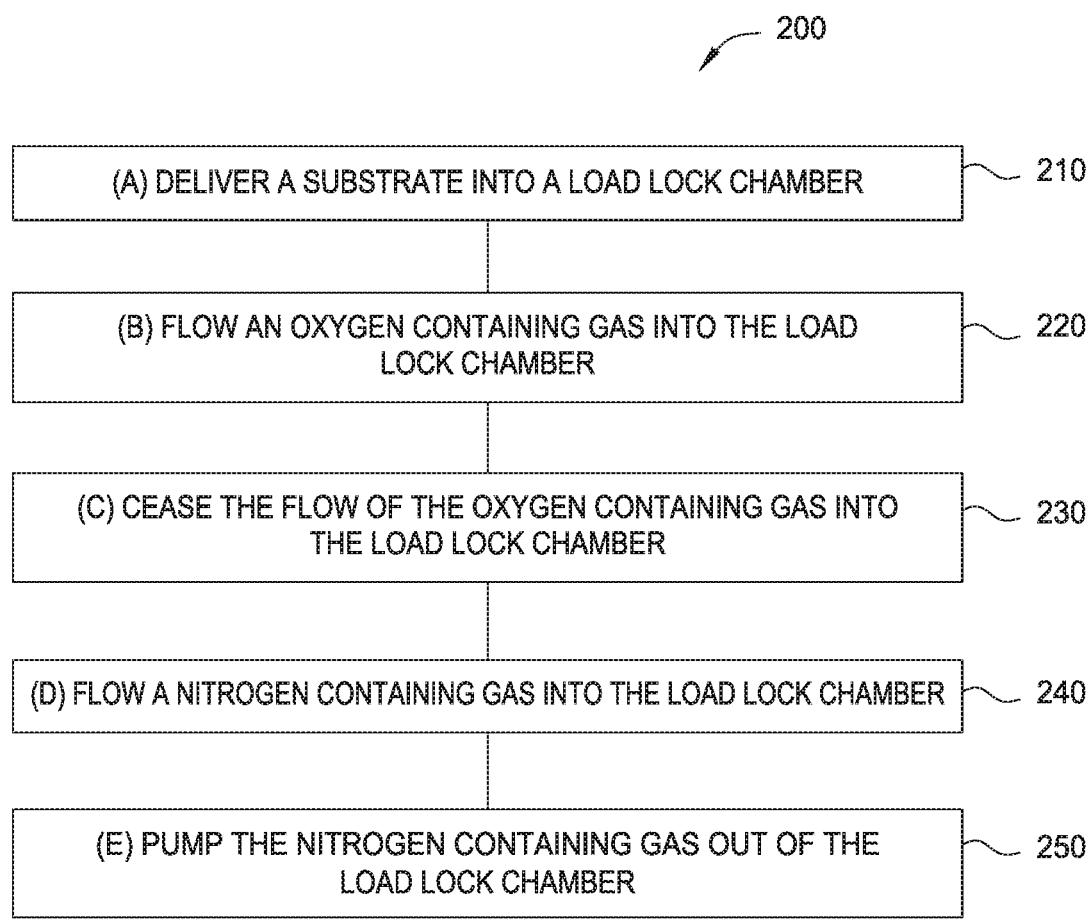
FIG. 2 illustrates a schematic flow diagram of a method for controlling outgassing after a III-V epitaxial process, according to one embodiment.

FIG. 2 is a schematic flow diagram of a method 200 for controlling outgassing after a III-V epitaxial process. The method 200 provides a solution for reducing outgassing.

At operation 210, a substrate is delivered to a load lock chamber.

At operation 220, an oxygen containing gas is flowed into the load lock chamber. The flowing of the oxygen containing gas into the load lock chamber may expose the substrate therein to the oxygen containing gas. Upon contacting the substrate, any residual arsenic related species on a surface of the substrate, as well as on the III-V surface, is oxidized. The arsenic residuals are broken down to either stable oxides and/or byproducts which have a high vapor pressure, and therefore evaporate quickly. As such, the deliberate pulsing and/or providing of the oxygen containing gas into the load lock chamber may pre-remove arsenic in a controlled manner in order to appropriately abate the arsenic.

In some embodiments, the oxygen containing gas is oxygen. It is contemplated that any amount of oxygen containing gas may be flowed into the load lock chamber, however, in some embodiments, between about 5 sccm and about 1200 sccm of the oxygen containing gas is flowed into the load lock chamber.

The oxygen containing gas is flowed into the load lock chamber for between about one second and about 60 seconds, for example, between about one second and about 30 seconds, such as about 10 seconds. Furthermore, the oxygen containing gas is flowed into the load lock chamber at a first pressure (P1). In some embodiments, the first pressure (P1) is between about 60 Torr and about 220 Torr, for example between about 80 Torr and about 200 Torr.

Flowing the oxygen containing gas into the load lock chamber may allow for stable oxides to form on the surface of the substrate. Also, the oxygen containing gas may allow high vapor pressure byproducts may be removed from the substrate.

At operation 230, the flow of the oxygen containing gas into the load lock chamber is ceased.

At operation 240, a nitrogen containing gas is flowed into the load lock chamber. The nitrogen containing gas is flowed into the load lock chamber for between about 30 seconds and about 400 seconds, for example, between about 60 seconds and about 300 seconds. In some embodiments, the nitrogen containing gas flows into the load lock chamber at a second pressure (P2). Furthermore, the second pressure (P2) is greater than the first pressure (P1), discussed supra. In some embodiments, the second pressure (P2) is above about 180 Torr, for example, above about 200 Torr. In some embodiments, the nitrogen containing gas is $N_2$. The flowing of the nitrogen containing gas into the load lock chamber may occur after the flowing of the oxygen containing gas into the load lock chamber. The flowing of nitrogen containing gas after oxidation drives down outgassing towards to the zero ppb level.

At operation 250, the nitrogen containing gas is pumped out of the load lock chamber. The removing of the nitrogen containing gas from the load lock chamber is at a third pressure (P3). The third pressure is less than the first pressure (P1). In some embodiments, the third pressure is less than about 1 Torr. The third pressure (P3) is lower than the second pressure (P2) and/or the first pressure (P1) during the removal of the nitrogen containing gas such that when the nitrogen containing gas is reinserted into the load lock chamber a strong dilution is provided for. Furthermore, the first pressure (P1) being less than the second pressure (P2) provides for efficiency benefits to improve the reaction rate.

The method 200 may also include repeating the flowing of the nitrogen containing gas into the load lock chamber as in operation 240 and/or the pumping of the nitrogen-containing gas out of the load lock chamber as in operation 250, for at least one additional cycle. By repeating the flowing of the nitrogen containing gas into the load lock chamber and removing the nitrogen containing gas from the load lock chamber, outgassing is further driven down towards the zero ppb level. Testing has been completed and results indicate that one oxidation operation and three nitrogen containing gas cycles reduce outgassing to zero ppb. In some embodiments, the method 200 may also include removing a material from a surface of the substrate by reacting the oxygen containing gas with the surface of the substrate. In some embodiments, after outgassing has been reduced, the substrate may be transferred to a FOUP (front opening unified pod) for further down-stream processing.

Figure 3:
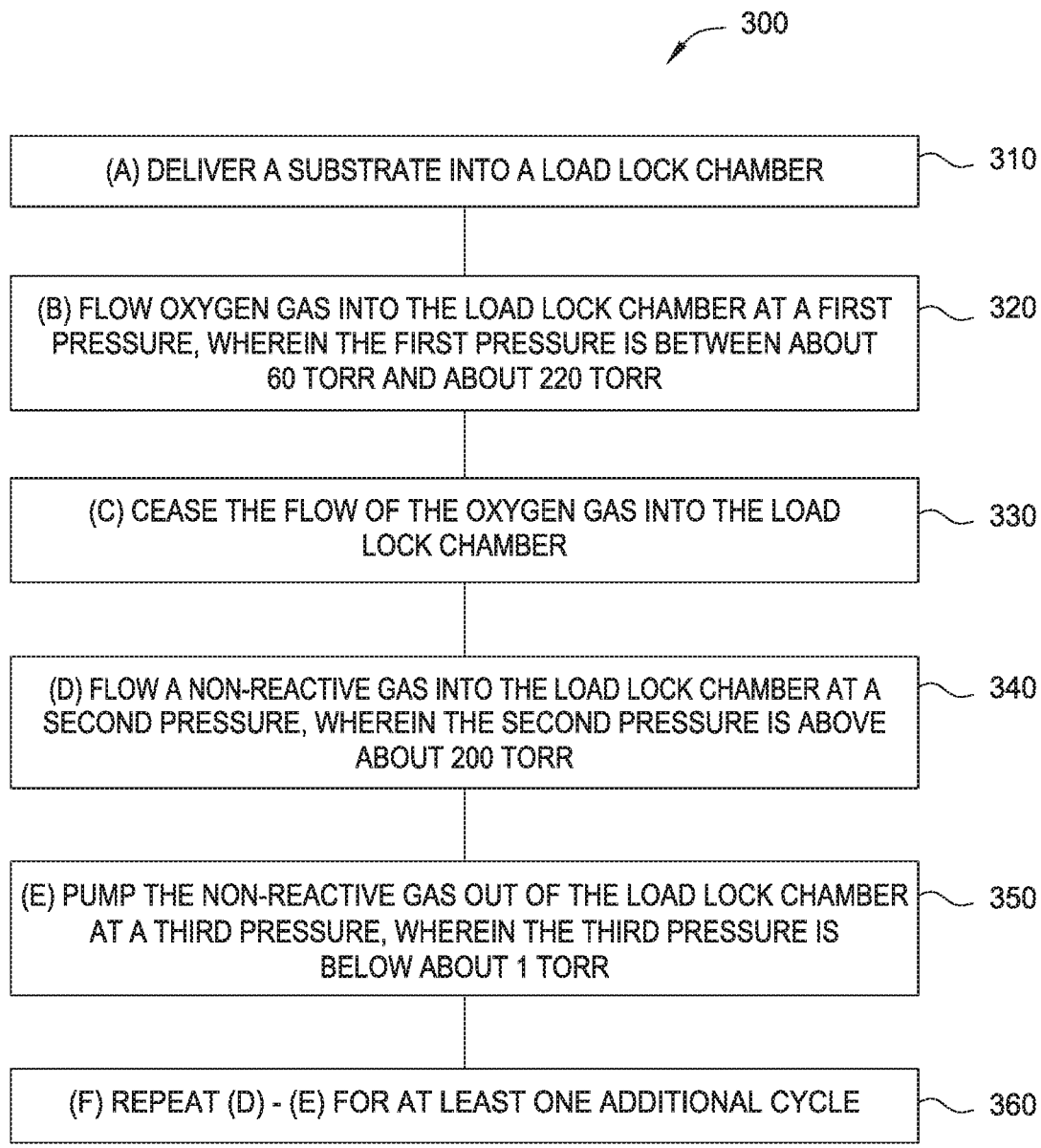
FIG. 3 illustrates a schematic flow diagram of a method for controlling outgassing, according to one embodiment.

FIG. 3 is a schematic flow diagram of a method 300 for controlling outgassing. The method 300 provides a solution for reducing outgassing.

At operation 310, a substrate is delivered to a load lock chamber.

At operation 320, oxygen gas is flows into the load lock chamber at a first pressure (P1). The first pressure (P1) is between about 30 Torr and about 300 Torr. The flowing of the oxygen gas into the load lock chamber may expose the substrate therein to the oxygen gas. Upon contacting the substrate, any residual arsenic related species on a surface of the substrate, as well as on the III-V surface, are oxidized. The arsenic residuals are broken down to either stable oxides and/or byproducts which have a high vapor pressure, and therefore evaporate quickly. As such, the deliberate pulsing and/or providing of the oxygen gas into the load lock chamber may pre-remove arsenic in a controlled manner in order to appropriately abate the arsenic.

It is contemplated that any amount of oxygen gas may be flowed into the load lock chamber, however, in some embodiments, between about 5 sccm and about 1200 sccm of the oxygen gas is flowed into the load lock chamber.

The oxygen gas is flowed into the load lock chamber for between about one second and about 60 seconds, for example, between about one second and about 30 seconds, such as about 10 seconds. Furthermore, the oxygen gas is flowed into the load lock chamber at a first pressure (P1). In some embodiments, the first pressure (P1) is between about 30 Torr and about 300 Torr, for example between about 80 Torr and about 200 Torr.

Flowing the oxygen gas into the load lock chamber may allow for stable oxides to form on the surface of the substrate. Also, the oxygen gas may allow high vapor pressure byproducts may be removed from the substrate.

At operation 330, the flow of the oxygen gas into the load lock chamber is ceased.

At operation 340, a non-reactive gas is flowed into the load lock chamber at a second pressure (P2). The second pressure (P2) is above about 180 Torr, for example above about 200 Torr. The non-reactive gas is flowed into the load lock chamber for between about 30 seconds and about 400 seconds, for example, between about 60 seconds and about 300 seconds. In some embodiments, the non-reactive gas is $N_2$. The flowing of the non-reactive gas into the load lock chamber may occur after the flowing of the oxygen gas into the load lock chamber. The flowing of the non-reactive gas after oxidation drives down outgassing towards to the zero ppb level. The zero ppb level means that the outgassing of toxic species, for example, arsenic, is undetectable.

At operation 350, the non-reactive gas is pumped out of the load lock chamber at a third pressure (P3). The third pressure is below about 1 Torr. The third pressure (P3) is lower than the second pressure (P2) and/or the first pressure (P1) during the removal of the non-reactive gas such that when the non-reactive gas is reinserted into the load lock chamber a strong dilution is provided for. Furthermore, the first pressure (P1) being less than the second pressure (P2) provides for efficiency benefits to improve the reaction rate.

At operation 360, operation 340 and operation 350 are repeated for at least one additional cycle. By repeating the flowing of the non-reactive gas into the load lock chamber and removing the non-reactive gas from the load lock chamber, outgassing is further driven down towards the zero ppb level. Testing has been completed and results indicate that one oxidation operation and three non-reactive gas cycles reduce outgassing to zero ppb. In some embodiments, the method 200 may also include removing a material from a surface of the substrate by reacting the oxygen containing gas with the surface of the substrate. In some embodiments, after outgassing has been reduced, the substrate may be transferred to a FOUP (front opening unified pod) for further down-stream processing.

Figure 4:
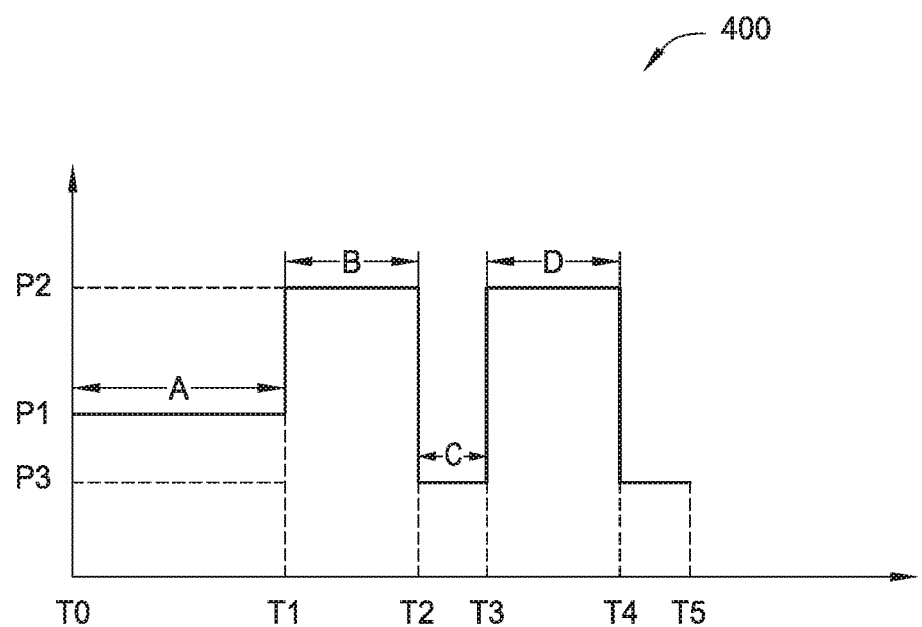
FIG. 4 schematically illustrates a graph showing operations for controlling outgassing.

FIG. 4 schematically illustrates a graph 400 showing operations for controlling outgassing, as discussed supra. As shown, an oxygen containing gas is flowed into the load lock chamber at a first pressure (P1) in the section marked A, between time T0 and time T1. The span of time between T0 and T1 may be between about one second and about 60 seconds. At time T1 the flowing of the oxygen containing gas into the load lock chamber is ceased. The non-reactive gas is flowed into the load lock chamber at a second pressure (P2) in the section marked B, between time T1 and time T2. The span of time between T1 and T2 may be between about 30 seconds and about 400 seconds. At time T2 the flowing of the non-reactive gas into the load lock chamber is stopped. Furthermore, the non-reactive gas is pumped out of the load lock chamber at a third pressure (P3) between time T2 and time T3 as shown in the section marked C. The span of time between T2 and T2 may be between about 30 seconds and about 400 seconds. A subsequent non-reactive gas flow and removal cycle may occur in the section marked D between time T3 and time T5.

Testing has been completed and results indicate that after an exposure to an oxygen containing gas residual arsenic related species on the substrate and/or on the surface of the substrate, as well as on the III-V surface, are oxidized. The arsenic residuals are broken down to either stable oxides or byproducts which have high vapor pressure and evaporate quickly. Also, after oxidation, the non-reactive gas pump/purge cycle is completed, thus driving down outgassing to zero ppb. Results indicate that after one oxidation and three non-reactive gas pump/purge cycles, outgassing was reduced to zero ppb, thus leaving no outgassing residuals and further improving throughput.

Benefits of the present disclosure include improved substrate throughput, as well as substrates in which residual arsenic outgassing gasses are eliminated before transfer to a FOUP. Furthermore, fume hoods are not necessary to control outgassing. Outgassing is controlled and removed prior to subsequent processes between chambers and/or tools.

Additional benefits include reduced contaminations and cross-contaminations. Also, the present disclosure may be applied to all arsenic and/or phosphate implantations, and is not limited to III-V implantations.

To summarize, the embodiments disclosed herein relate to methods for controlling substrate outgassing such that hazardous gasses are eliminated from a surface of a substrate after a III-V epitaxial growth process or an etch clean process, and prior to additional processing. An oxygen containing gas is flowed to a substrate in a load lock chamber, and subsequently a non-reactive gas is flowed to the substrate in the load lock chamber. As such, hazardous gases and outgassing residuals are decreased and/or removed from the substrate such that further processing may be performed.

While the foregoing is directed to embodiments of the present disclosure, other and further embodiments of the disclosure may be devised without departing from the basic scope thereof, and the scope thereof is determined by the claims that follow.

What is claimed is:
1. A method, comprising:
   (a) depositing an epitaxial layer on a surface of a substrate in a chamber;
   (b) removing the substrate having the epitaxial layer thereon from the chamber and delivering the substrate into a substrate access chamber;
   (c) flowing an oxygen containing gas into the substrate access chamber at a first pressure;
   (d) removing residuals of the epitaxial layer deposition from the epitaxial layer by reacting the oxygen containing gas with the residuals of the epitaxial layer deposited;
   (e) ceasing the flow of the oxygen containing gas into the substrate access chamber;
   (f) flowing a non-reactive gas into the substrate access chamber at a second pressure greater than the first pressure;
   (g) ceasing the flow of the non-reactive gas into the substrate access chamber; and
   (h) removing the non-reactive gas from the substrate access chamber.
2. The method of claim 1, further comprising:
   (i) repeating (f)-(h) for at least one additional cycle.
3. The method of claim 1, wherein the non-reactive gas is a nitrogen-containing gas.

4. The method of claim 1, wherein the oxygen containing gas is oxygen.

5. The method of claim 1, wherein the first pressure is between about 60 Torr and about 220 Torr.

6. The method of claim 1, wherein the second pressure is above about 200 Torr.

7. The method of claim 1, wherein the removing of the non-reactive gas from the substrate access chamber is at a third pressure, wherein the third pressure is less than the first pressure.

8. The method of claim 7, wherein the third pressure is less than about 1 Torr.

9. The method of claim 1, wherein the flowing of the oxygen containing gas into the substrate access chamber occurs for between about 1 second and about 60 seconds.

10. The method of claim 1, wherein the flowing of the non-reactive gas into the substrate access chamber occurs for between about 30 seconds and about 400 seconds.

11. The method of claim 1, wherein the flowing of the oxygen containing gas into the substrate access chamber is via a conduit from the oxygen containing gas source to the substrate access chamber.

12. A method, comprising:
   (a) depositing an epitaxial layer on a surface of a substrate in a chamber;
   (b) removing the substrate having the epitaxial layer thereon from the chamber and delivering the substrate into a load lock chamber;
   (c) flowing an oxygen containing gas into the load lock chamber at a first pressure, the first pressure is between about 60 Torr and about 220 Torr;
   (d) removing residuals of the epitaxial layer deposition from the epitaxial layer by reacting the oxygen containing gas with the residuals of the epitaxial layer deposited;
   (e) ceasing the flowing of the oxygen containing gas into the load lock chamber;
   (f) flowing a nitrogen containing gas into the load lock chamber at a second pressure greater than the first pressure; and
   (g) pumping the nitrogen containing gas out of the load lock chamber.

13. The method of claim 12, further comprising:
   (h) repeating (f)-(g) for at least one additional cycle.

14. The method of claim 12, wherein the second pressure is above about 200 Torr.

15. The method of claim 12, wherein the pumping of the nitrogen containing gas out of the load lock chamber is at a third pressure, wherein the third pressure is less than the first pressure.

16. The method of claim 12, wherein the flowing of the oxygen containing gas into the load lock chamber occurs for between about 1 second and about 60 seconds, and the flowing of the nitrogen containing gas into the load lock chamber occurs for between about 30 seconds and about 400 seconds.

17. A method for controlling outgassing, comprising:
   (a) depositing an epitaxial layer on a surface of a substrate in a chamber;
   (b) removing the substrate having the epitaxial layer thereon from the chamber and delivering the substrate to a load lock chamber;
   (c) flowing oxygen gas into the load lock chamber at a first pressure, wherein the first pressure is between about 60 Torr and about 220 Torr;
   (d) removing residuals of the epitaxial layer deposition from the epitaxial layer by reacting the oxygen gas with the residuals of the epitaxial layer deposited;
   (e) ceasing the flowing of the oxygen gas into the load lock chamber;
   (f) flowing a non-reactive gas into the load lock chamber at a second pressure, wherein the second pressure is above about 200 Torr;
   (g) pumping the non-reactive gas out of the load lock chamber at a third pressure, wherein the third pressure is below about 1 Torr; and
   (h) repeating (f)-(g) for at least one additional cycle.

* * * * *